US007304388B2

(12) United States Patent
Dubin et al.

(10) Patent No.: US 7,304,388 B2
(45) Date of Patent: Dec. 4, 2007

(54) METHOD AND APPARATUS FOR AN IMPROVED AIR GAP INTERCONNECT STRUCTURE

(75) Inventors: Valery M. Dubin, Portland, OR (US); Peter K. Moon, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/608,948

(22) Filed: Jun. 26, 2003

(65) Prior Publication Data

US 2004/0266167 A1 Dec. 30, 2004

(51) Int. Cl.
*H01L 23/48* (2006.01)
(52) U.S. Cl. .................. 257/762; 257/750; 257/758
(58) Field of Classification Search .............. 257/762, 257/750, 758
See application file for complete search history.

(56) References Cited

U.S. PATENT DOCUMENTS

| 5,413,962 | A | * | 5/1995 | Lur et al. .................. 438/619 |
| 5,695,810 | A | | 12/1997 | Dubin et al. |
| 5,708,303 | A | * | 1/1998 | Jeng ............................ 257/758 |
| 5,900,668 | A | * | 5/1999 | Wollesen ...................... 257/522 |
| 5,953,626 | A | * | 9/1999 | Hause et al. ................. 438/622 |
| 6,667,552 | B1 | * | 12/2003 | Buynoski .................... 257/758 |
| 6,696,758 | B2 | * | 2/2004 | Dubin et al. ................ 257/750 |
| 6,908,829 | B2 | | 6/2005 | Hussein et al. |
| 2004/0061230 | A1 | | 4/2004 | Powers et al. |

OTHER PUBLICATIONS

Gosset, et al., "General review of issues and perspectives for advanced copper interconnections using air gap as ultra-low K material", 3 pages, Jun. 2003, Phillips Semiconductor Crolles R&D, 860 rue Jean Monnet 38920 Crolles France.
Noguchi, et al. "Simple Self-Aligned Air-Gap Interconnect Process with Cu/FSG Structure", 3 pages, Jun. 2003, Device Development Center, Hitachi, Ltd., Ome, Tokyo, 198-8512, Japan.
Paul A. Kohl et al., "Air-gaps in 0.3/spl mu/m electrical interconnections", IEEE Electron Device Letters, vol. 21, Issue 12, Dec. 2000, pp. 557-559.
Stefan P. Hau-Riege, "Probabilistic immortality of Cu damascene interconnects", Journal of Applied Physics, Feb. 15, 2002, vol. 19, Issue 4, pp. 2014-2022.

* cited by examiner

*Primary Examiner*—Douglas M. Menz
(74) *Attorney, Agent, or Firm*—Blakely, Sokoloff, Taylor & Zafman LLP

(57) ABSTRACT

In one embodiment, an apparatus comprises a first layer having at least one interconnect formed in an interlayer dielectric (ILD), a second layer formed over the first layer having a second at least one interconnect, a third layer formed over the second layer, the third layer defining at least one air gap between the second at least one interconnect and the third layer, and at least one shunt selectively covering the first and second at least one interconnects. In another embodiment, a method comprises forming a first layer comprising an ILD and a first at least one interconnect, forming a second layer over the first layer, the second layer having a second at least one interconnect, depositing at least one shunt over the first and second at least one interconnects, forming a third layer over the second layer, and evaporating a portion of the second layer to create at least one air gap between the second at least one interconnect and the third layer.

12 Claims, 16 Drawing Sheets

METHOD AND APPARATUS FOR AN IMPROVED AIR GAP INTERCONNECT STRUCTURE

FIELD OF THE INVENTION

The present invention relates to semiconductor fabrication. More specifically, the present invention relates to improvements to an air gap interconnect structure.

BACKGROUND

An integrated circuit (IC) typically comprises numerous semiconductor devices formed in single crystal silicon substrate. The semiconductor devices can be transistors, diodes, etc. The semiconductor devices must be connected with each other using conductive lines for the IC to function properly. The conductive lines are effectively wires that allow electrical communication between the semiconductor devices. Newer ICs, and especially microprocessors, are becoming increasingly complex. Because of the increasing number of semiconductor devices found in newer ICs, the number of conductive lines needed to connect the devices is also increasing. For complex ICs, a single layer of conductive lines is typically insufficient. As a result, the conductive lines must be layered upon one another to create layers of metallization. In order to isolate the conductive lines, an interlayer dielectric (ILD) is used. An ILD is an insulating layer such as silicon dioxide ($SiO_2$), which prevents shorts and unwanted communication between the conductive lines.

One way to fabricate layers of metallization for an IC involves using what is known as a damascene process. The first procedure of a damascene process is to deposit an ILD. An ILD is deposited either directly on a substrate, or over another existing layer of metallization. Once the ILD is deposited, portions of the ILD may be etched away to form recessed features, such as trenches and vias, which will accommodate the conductive lines. A trench can be created to accommodate an interconnect, which can connect different regions of the IC. A via can be created to accommodate either a via or a contact, which will allow for communication between the interconnects of other layers or directly with the semiconductor devices in the substrate. A damascene process that creates either only trenches or vias is known as a single damascene process. A damascene process that creates both trenches and vias at once is known as a dual damascene process.

After the recessed features are created, metal, such as copper or aluminum, is deposited in them to create the conductive lines. In a damascene process, metal may be deposited using several well-known deposition techniques, including electroplating and electroless (EL) deposition. An electroplating process typically requires a conductive seed layer, such as a copper seed layer, to first be deposited over the recessed features. The substrate can then be dipped in a chemical bath. The seed layer creates a conductive path, and when a current is applied to the seed layer relative to the chemical bath, ions will adhere to the seed layer, and the recessed features will be filled. An EL deposition process does not require a seed layer. Instead, the ILD or another layer can be activated using a noble metal compound, such as a palladium (Pd) compound. Once the ILD or other layer is activated, the substrate can be deposited in a bath, and ions will adhere to the activated areas.

The electroplating and EL deposition processes typically deposit excess metal, which overfills the trenches and covers the top surface of the ILD. The excess metal can be removed using a chemical mechanical polishing (CMP) process. The CMP process involves introducing a chemical slurry to the surface of the ILD while using a rotating polishing pad to remove excess metal and planarize the surface of the ILD.

Because feature sizes in ICs have recently become so small, the conductive lines formed in layers of metallization are now separated by increasingly smaller gaps. An ILD comprises a dielectric material, which has a tendency to store charge, and can cause problems such as cross-talk and capacitive coupling between the conductive lines. A typical material used for an ILD is $SiO_2$. $SiO_2$ has a dielectric constant (k) of approximately 4.0. Due to the reduction in feature size and distance between the conductive lines, it has become desirable to use low-k dielectrics to reduce cross-talk and capacitive coupling. A low-k dielectric is typically defined as one having a dielectric constant of less than that of $SiO_2$, or of less than 4.0. Air is the ultimate low-k dielectric, having a dielectric constant of approximately 1.0. Metallization layers having air gaps formed in them have been created to lower the dielectric constant of the layer. However, these layers typically are very weak, and can suffer from defects due to processing and other handling.

Diffusion and electromigration of metals such as copper and aluminum can cause the failure of interconnect structures. Further, interconnects can physically extrude into adjacent areas. These problems can become especially acute when using air gap structures because of their already structurally weak natures.

DETAILED DESCRIPTION

Described herein is a method and apparatus for improved air gap metallization layers. In the following description, numerous specific details are set forth. However, it is understood that embodiments may be practiced without these specific details. For example, well known equivalent materials may be substituted in place of those described herein, and similarly, well known equivalent techniques may be substituted in place of particular semiconductor processing techniques disclosed herein. In other instances, well known structures and techniques have not been shown in detail in order not to obscure the understanding of this description.

A layer of metallization can be created having interconnects and other structures therein. Air gaps can be formed between the interconnects to create a very low-k metallization structure. Cobalt (Co) or nickel (Ni) shunts can be deposited on top of the interconnects in the air gap structure to act as diffusion barriers protecting higher level ILDs from electromigration and diffusion caused by the interconnects. In another embodiment, electrolessly (EL) deposited Co or Ni via plugs can be deposited in the air gap structure.

Because the vias typically handle a smaller amount of current than the interconnects, the lower conductivity of the Co or Ni via plugs will not adversely affect the performance of the vias relative to the interconnects. Further, Co or Ni will not diffuse or electromigrate into unlanded portions of ILDs. In a further embodiment, a thick barrier layer comprising tantalum (Ta), tantalum nitride (TaN), etc. and having a thickness in between 50 and 500 angstroms can be deposited in the recessed features of an ILD used in air gap structure. The thick barrier layer can act as a diffusion layer to prevent copper from diffusing into the ILD, can act as an adhesion layer, can carry electrical current where there is a void in a conductive line (e.g., a short), and can provide additional mechanical strength for the conductive lines.

Figure 1A:
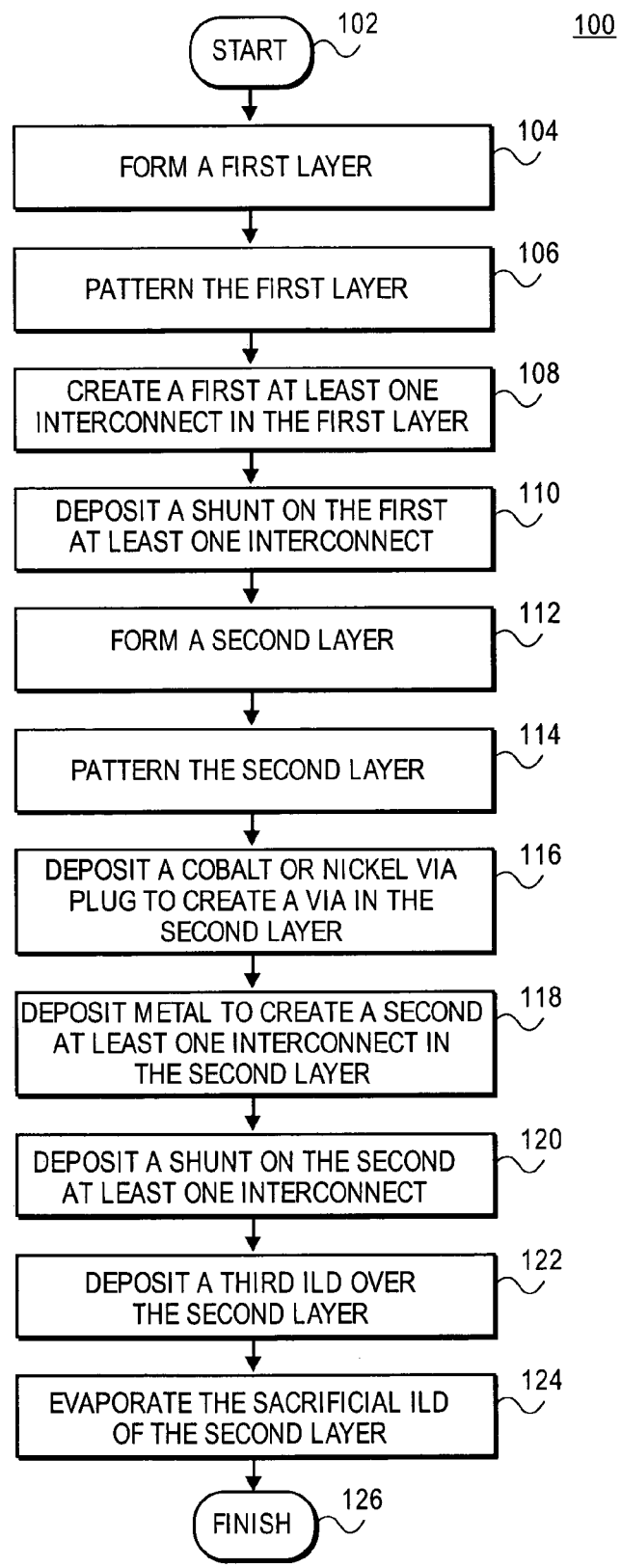
FIGS. 1A and 1B illustrate an embodiment for improving a metallization air gap structure.
Figure 1B:
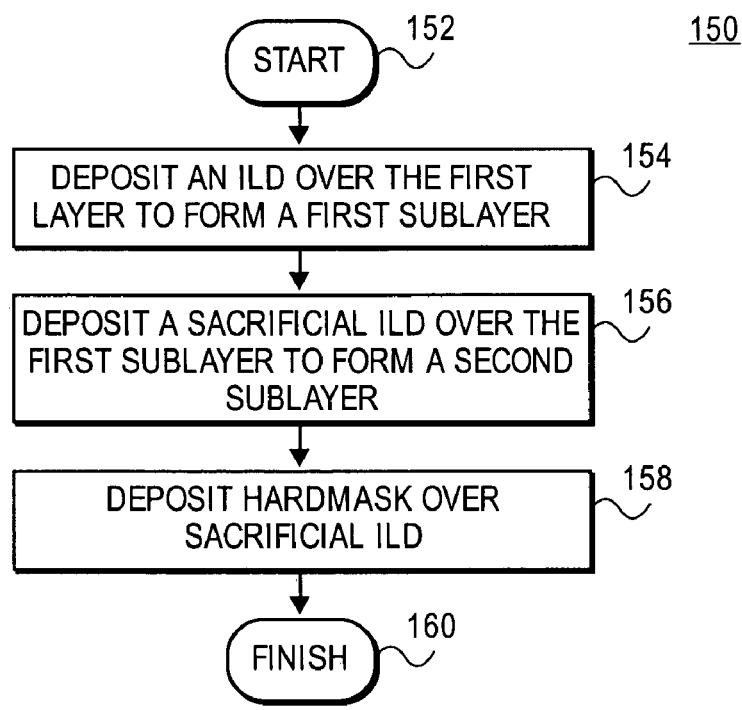
Figure 2A:
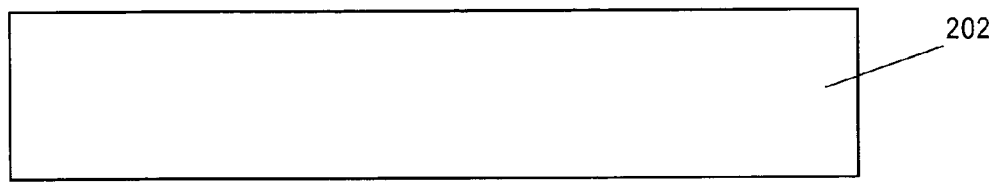
FIGS. 2A through 2M illustrate a process of forming an improved air gap interconnect structure.
Figure 2B:
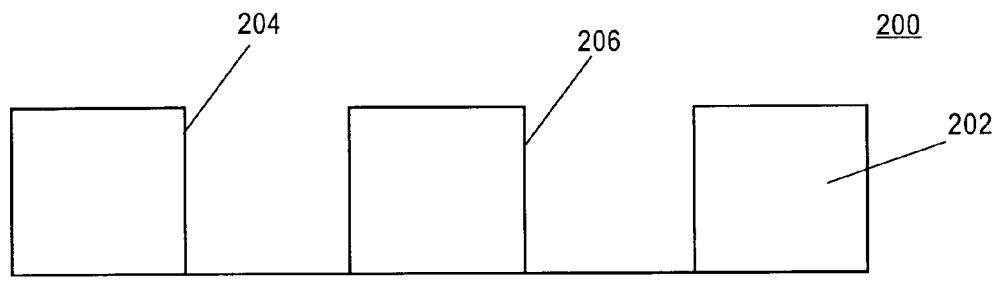
Figure 2C:
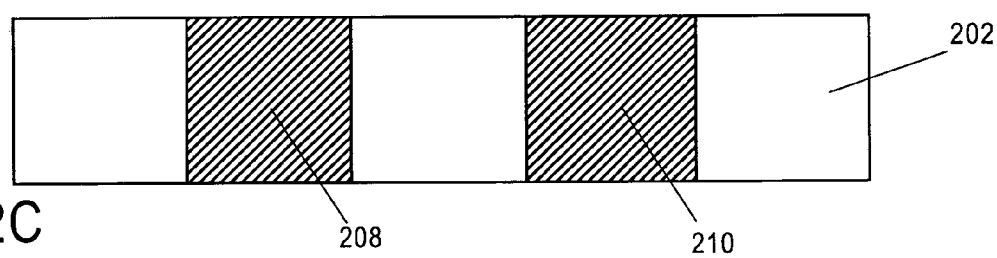

FIGS. 1A and 1B illustrate an embodiment for improving a metallization air gap structure. FIGS. 2A through 2M illustrate a process of forming an improved air gap interconnect structure. The process 100 begins in start block 102. In block 104, a first layer ILD is formed. FIG. 2A illustrates a deposited first layer ILD. The first layer 202 may be any appropriate ILD, including $SiO_2$ or low-k ILDs such as carbon doped oxides (CDO) and fluorosilicate glasses (FSG). The ILD may be deposited using various well-known methods such as chemical vapor deposition (CVD), spin on deposition, etc. The ILD may be deposited directly on a substrate, or over another, previously formed, metallization layer. In block 106, the first layer 202 is patterned using a damascene process. FIG. 2B illustrates the first layer 202 having two damascene patterned trenches 204 and 206. In block 108, a first at least one interconnect is created in the first layer. FIG. 2C illustrates the first layer 202 having two interconnects 208 and 210 formed in it. The interconnects 208 and 210 can be created by depositing copper, aluminum, or other appropriate metals in the ILD 202 using electroplating, EL deposition, etc. After the interconnects 208 and 210 have been formed, the ILD 202 must be cleared of excess metal and planarized using a CMP process.

Figure 2D:
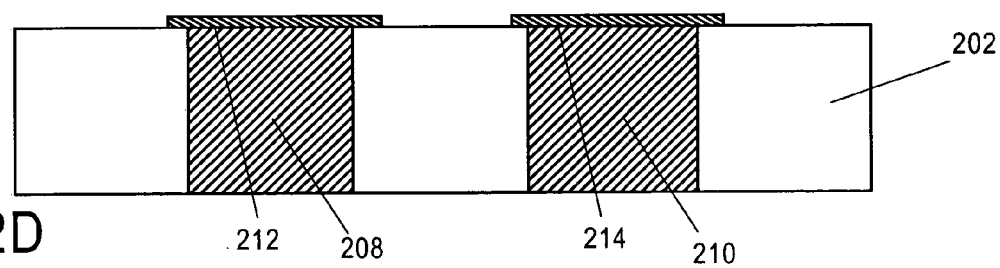

In block 110, a shunt is deposited on the first at least one interconnect. FIG. 2D illustrates the interconnects 208 and 210 having shunts 212 and 214 deposited over them. The selective shunts 212 and 214 can comprise Co or Ni and can be deposited using an EL deposition process. The shunts 212 and 214 can also comprise the alloys of Co and Ni with phosphorous (P), boron (B), tungsten (W), rhenium (Re), molybdenum (Mo), and the alloys of tungsten (W) with boron (B), carbon (C), and nitrogen (N). The shunts 212 and 214 are selectively deposited over the interconnects 208 and 210. This can be achieved using an EL deposition process. Depending on the metal used for the interconnects and the material to be used for the shunts, an activation compound can be chosen to activate the interconnects 208 and 210. Once the interconnects 208 and 210 are activated, the wafer can be deposited in a bath, and ions will adhere to the interconnects 208 and 210. The shunts 212 and 214 will then grow, and may grow over a portion of the ILD 202 adjacent to the interconnects 208 and 210. The selective shunts 212 and 214 remain conductive, allowing communication between the interconnects 208 and 210 and higher layers, while providing protection against electromigration and diffusion. Interconnect structures using air gaps are inherently structurally weak and diffusion and extrusion of interconnects can further weaken the structures.

Figure 2E:
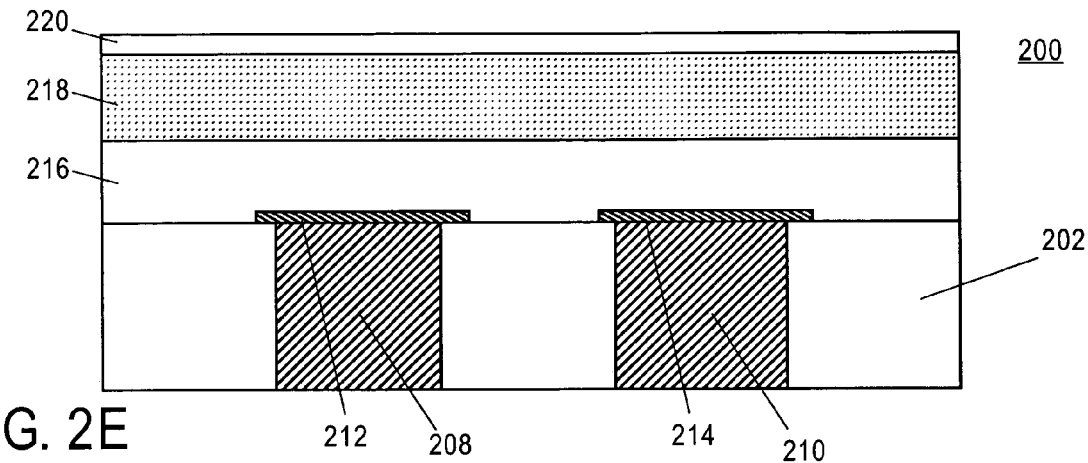

In block 112 a second layer is formed. FIG. 2E illustrates a second layer being formed over the first layer ILD 202. The process 150 in FIG. 1B, illustrates a process for forming a second layer. In one embodiment, the second layer will comprise a typical ILD 216 in the via height portion of the layer, and a sacrificial ILD 218 in the trench height portion of the layer. The sacrificial ILD 218 can act as a placeholder that will allow a structure to be built on top of it, and it can later be evaporated to form air gaps in the trench height portion of the second layer. This process 150 begins in start block 152. In block 154, the ILD 216 is deposited over the first ILD 202 to form a first sublayer of the second layer. The ILD 216 can comprise an ILD of the same or similar dielectric material used to create the first layer 202. The first sublayer 216 is the via height portion of the second layer. As such, $SiO_2$ or other similar dielectrics may be used, since the vias are spaced further apart than the interconnects, therefore resulting in less capacitive coupling. In block 156, a sacrificial ILD 218 is deposited over the first sublayer 216 to form the second sublayer. The sacrificial ILD 218 can be a thermally decomposing polymer such as Unity™, by Promerus LLC of Brecksville, Ohio, which will decompose at approximately 400° centigrade. When the sacrificial ILD 218 is decomposed, air gaps will form where the sacrificial ILD 218 once was. In block 158, a hard mask 220 can then be deposited on top of the sacrificial ILD 218 to protect the sacrificial ILD 218 during processing. The process 150 is finished in block 160.

Figure 2F:
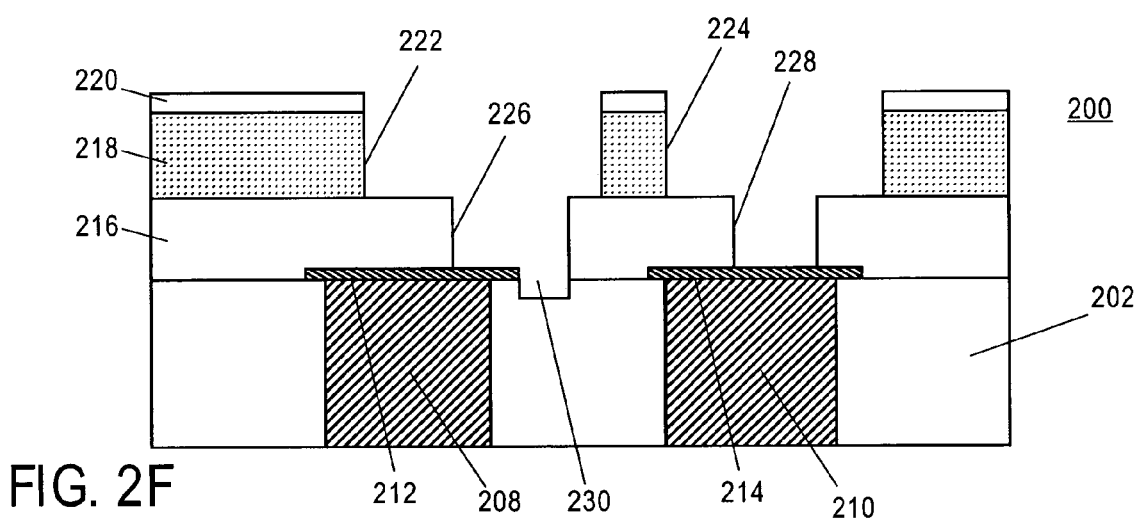
Figure 2G:
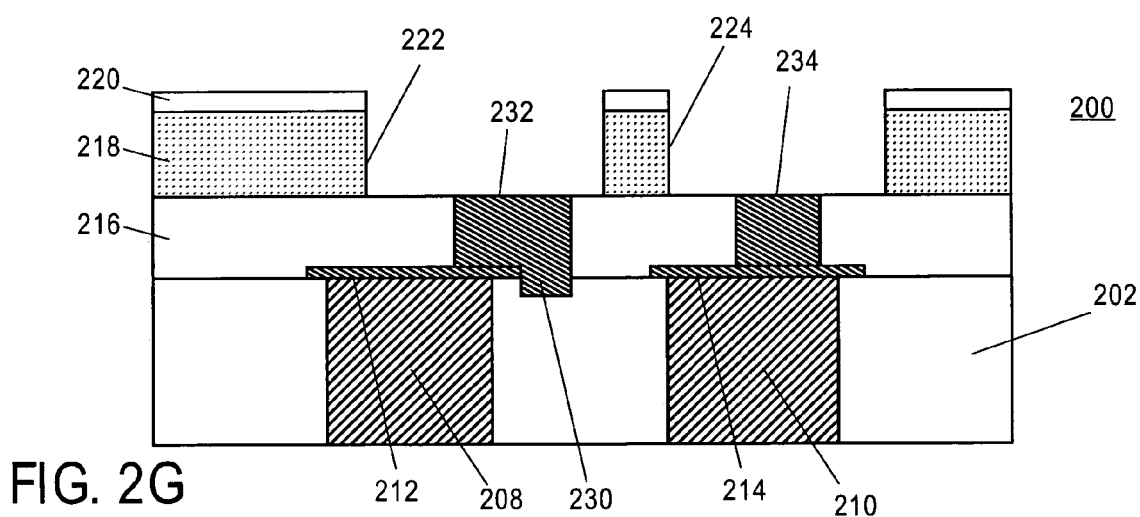

In block 114, the second layer is patterned. FIG. 2F illustrates the second layer having damascene patterned recessed features. The second layer can be patterned using a dual damascene process to create trenches 222 and 224, and vias 226 and 228. A dual damascene process is well known, and typically involves first etching a via, filling the via with a backfill, etching a trench, and removing the backfill to open the via. While creating the via 226, an unlanded portion 230 may have been inadvertently formed. The unlanded portion 226 has intruded into the ILD 202. Because the unlanded portion 230 is not directly above the interconnect 208 and the shunt 212, a metal via formed in the via 226 may readily diffuse or electromigrate into the ILD 202. To solve this problem, a Co or Ni via plug can be deposited to create a via in a second layer in block 116. FIG. 2G illustrates an interconnect structure having EL deposited via plugs. The via plugs 232 and 234 may be deposited using an EL deposition or other appropriate process. The via plugs 232 and 234 can be Co, Ni, or their alloys with phosphorous, boron, tungsten, rhenium, or molybdenum. The via plugs 232 and 234 can also comprise tungsten and its alloys with boron, carbon, and nitrogen. The EL deposition process can allow the via plugs 232 and 234 to form in the vias by activating the shunts 212 and 214, and allowing the plugs 232 and 234 to grow for a predetermined amount of time. The shunts 212 and 214 can be activated using a palladium (Pd) or other compound. Depending on the activation compound chosen, different materials can be activated and different materials can be deposited. Therefore, an activation compound should be chosen so that the shunts 212 and 214 can be activated, and the material chosen for the via plugs 232 and 234 can be deposited.

Figure 2H:
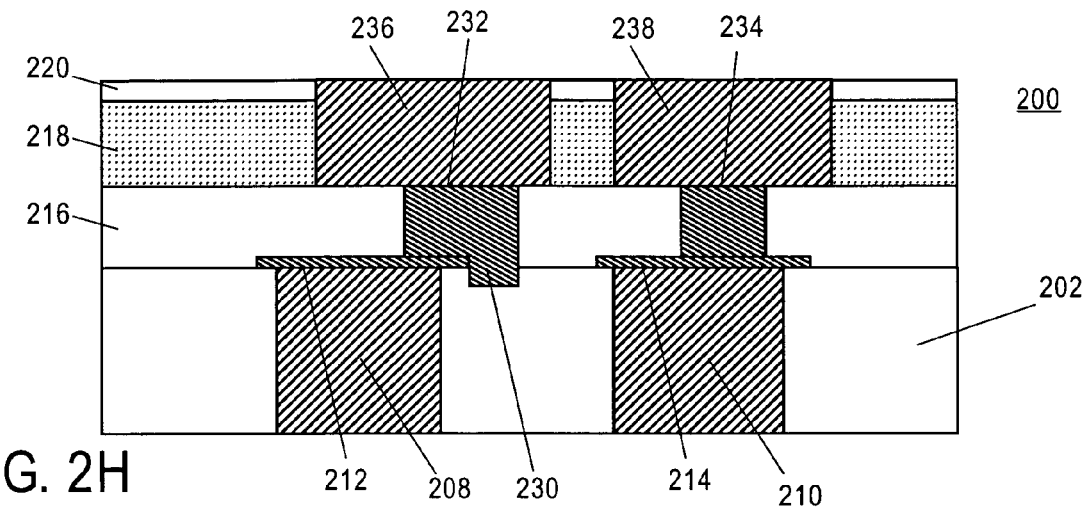
Figure 2I:
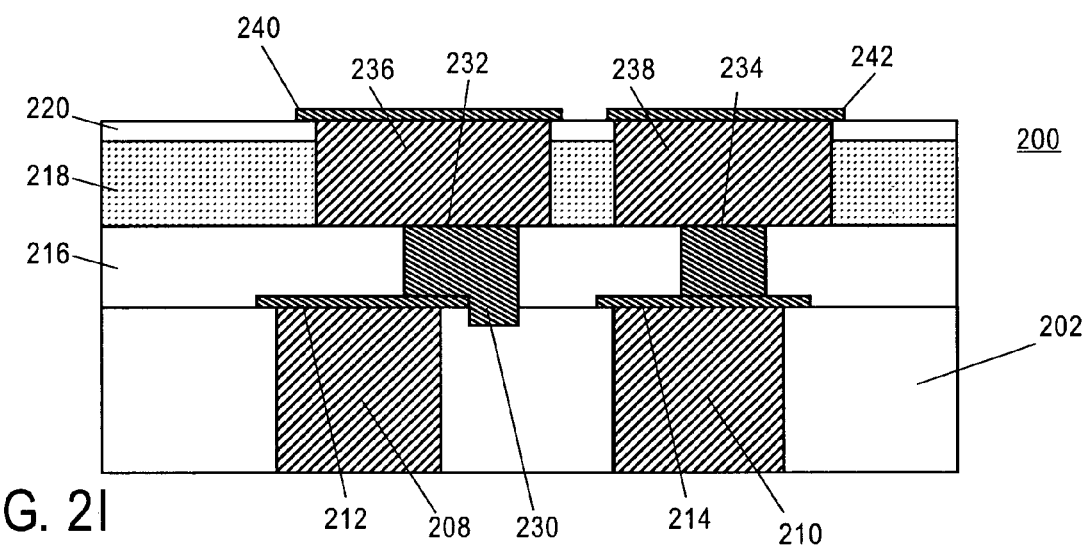
Figure 2J:
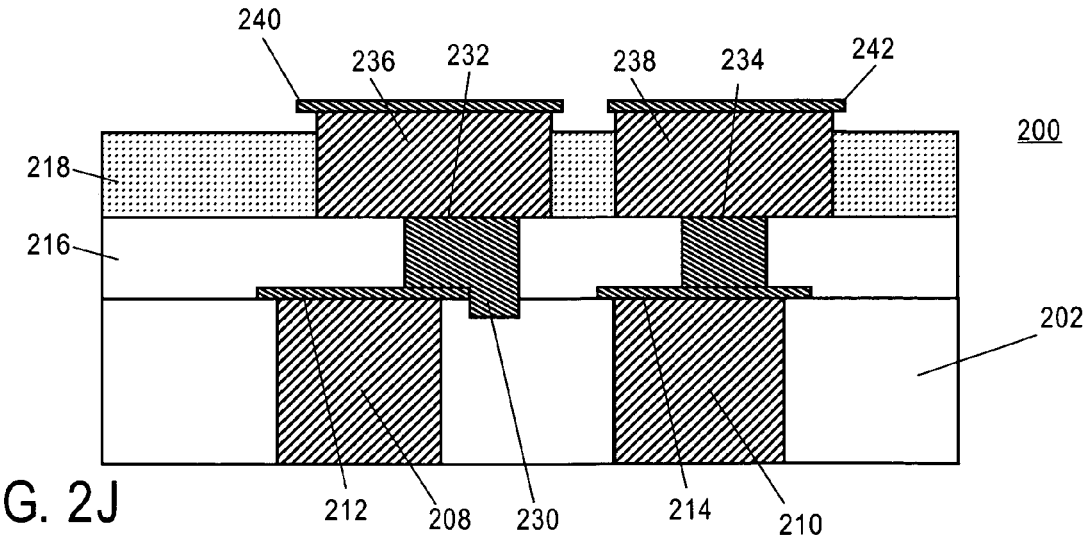

In block 118, metal is deposited to create a second at least one interconnect in the second layer. FIG. 2H illustrates a metallization structure having two interconnects 236 and 238 in the second layer. As above, the interconnects 236 and 238 can be created by depositing metal such as copper or aluminum in the trenches 222 and 224. After the interconnects 236 and 238 are formed, a shunt can be deposited on the second at least one interconnect in block 120. FIG. 2I illustrates two shunts 240 and 242 covering the interconnects 236 and 238. As above, the shunts 240 and 242 protect the ILD to be deposited above the sacrificial ILD 218 from electromigration or diffusion that can be caused by metal deposited as the interconnects 236 and 238. Also as above, the shunts 240 and 242 may be Co, Ni, or other appropriate materials, that may be deposited using EL deposition. Once the shunts 240 and 242 have been deposited, the hard mask 220 can be dissolved using the known methods. FIG. 2J illustrates the structure 200 after the hard mask 220 is removed. As can be seen in FIG. 2J, removing the hardmask 220 may also cause the removal of a portion of the sacrificial ILD 218.

Figure 2K:
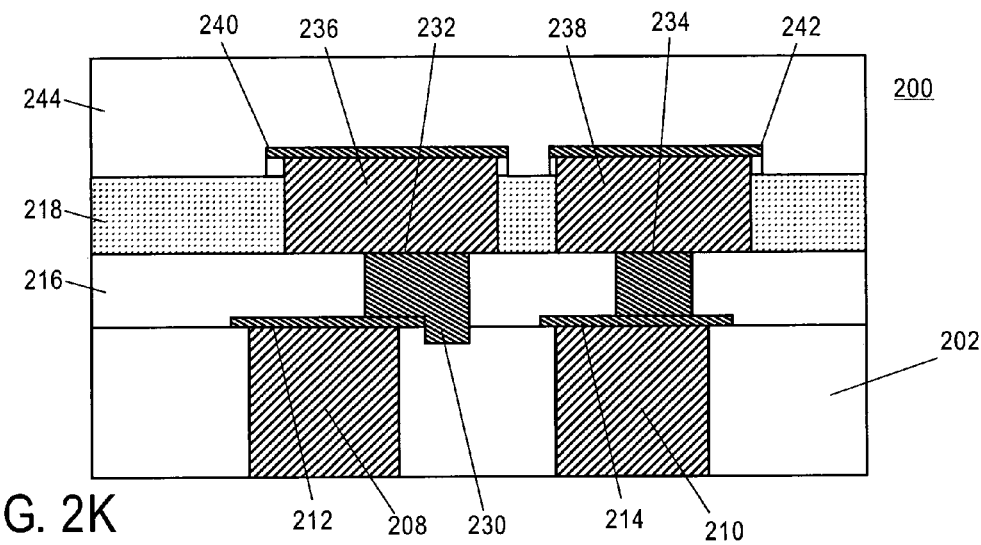
Figure 2L:
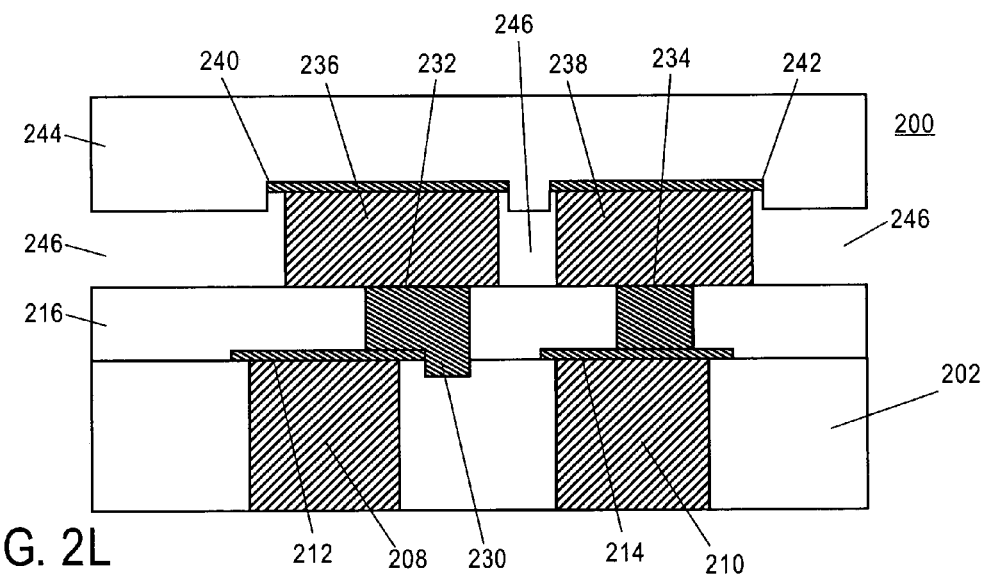

In block 122, a third ILD is deposited above the sacrificial ILD 218. FIG. 2K illustrates the structure 200 having a deposited third ILD 244. The deposited third ILD 244 may be $SiO_2$ or a low-k ILD. Once the third layer ILD 244 has been deposited, the sacrificial ILD 218 can be evaporated by heating the structure 200 to the temperature required to evaporate sacrificial ILD 218 in block 124. FIG. 2L illustrates a structure 200 having air gaps 246 formed in it. Once the sacrificial ILD 218 is evaporated, air gaps 246 have been created where the sacrificial ILD 218 previously was. Because of the low dielectric constant of the air gaps 246, a very low-k metallization structure 200 has been created. Further, the shunts 212, 214, 240, and 242 have prevented diffusion into the ILDs 216 and 244, and the via plug 232 has prevented diffusion into the ILD 202. For example, if copper were deposited as a via, and there was an unlanded portion 230, the copper would readily electromigrate and diffuse into the ILD 202. The cobalt or nickel used for the via plug 232 remains conductive while not contaminating the ILD 202. Because of the protection provided by the shunts and via plugs, the yields of device created using air gap structures in this manner should increase dramatically. In the finish block 126, the process 100 is complete.

Figure 2M:
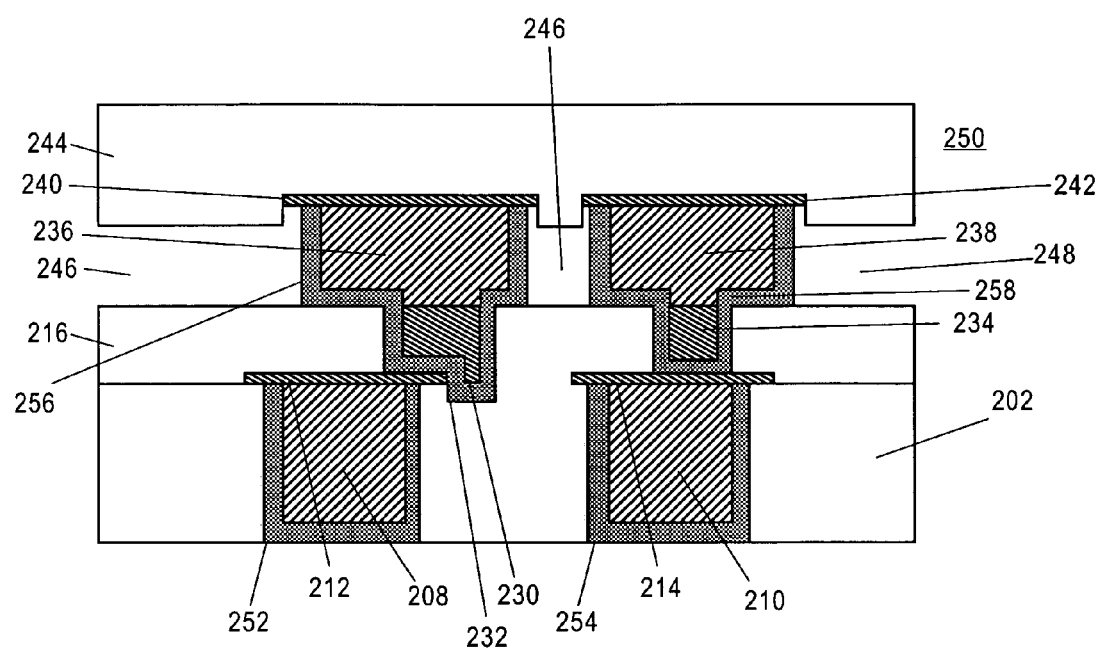

FIG. 2M illustrates an air gap structure 250 comprising interconnects 208, 210, 236, and 238 surrounded by barrier layers, via plugs, and shunts. The structure 250 has been created using a similar process as described in FIGS. 1A and 1B, although new thick barrier layers 252, 254, 256, and 258 have been deposited to act as diffusion barriers for interconnects 208, 210, 236, and 238, respectively. The thick barrier layer can provide mechanical strength for the interconnects and provide conductivity in voids created during the formation of the conductive lines. This process will be explained further with respect to FIG. 5.

The processes 100 and 150 use a sacrificial ILD 218 to create air gaps 246 in the trench height portion of the second layer. The air gaps 246 will dramatically lower the dielectric constant of the metallization structure 200 because air has a dielectric constant of approximately 1.0. The air gaps 246 must typically be formed after the structure 200 has been created, because the air gaps 246 will leave the structure 200 in a weakened state, where it will be susceptible to damage while being processed. However, diffusion and electromigration caused by deposited metal, as well as extrusion of the metal, can weaken the structure 200 further. A combination of measures, including using Co, Ni, etc. shunts and via plugs can reduce the incidence of diffusion and electromigration, and can increase the yields of devices incorporating air gap interconnects.

Figure 3:
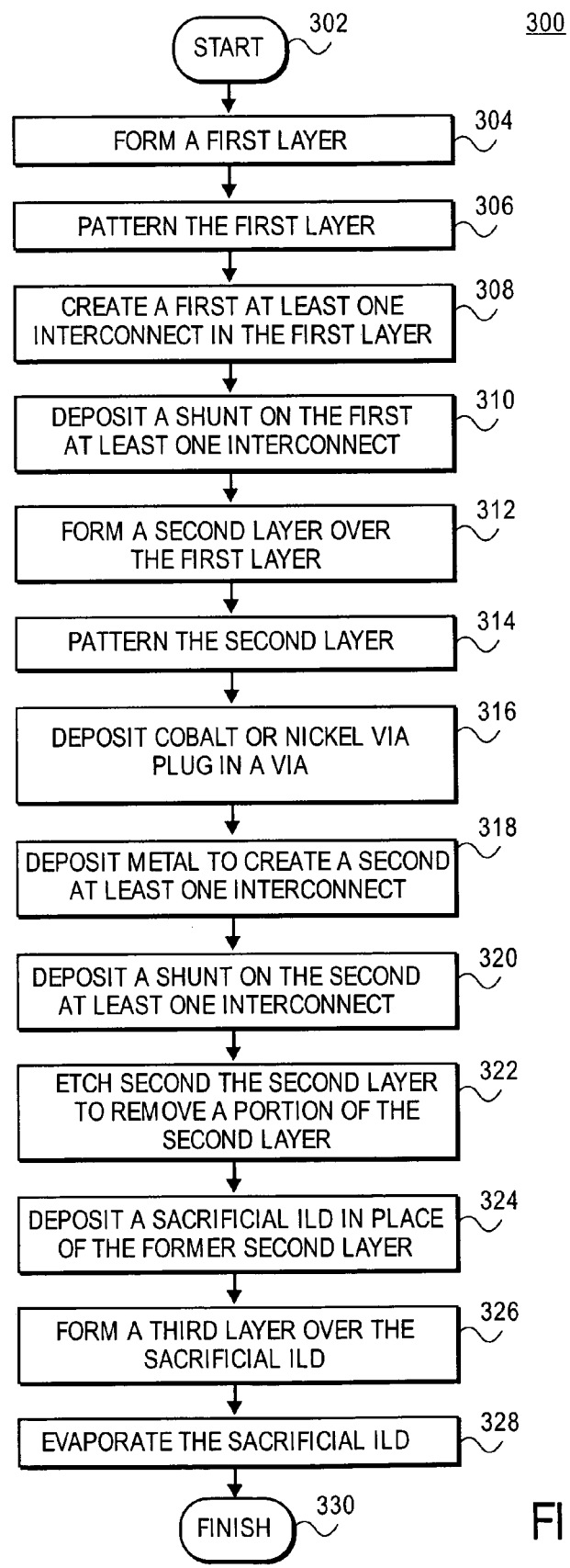
FIG. 3 illustrates an embodiment for fabricating shunts and via plugs in an air gap metallization structure.

Forming the air gaps 246 in the trench height portion of the second layer above is typically sufficient because most cross talk and capacitive coupling typically occurs in the trench height portion of a layer, since the interconnects tend to be physically closer together than the vias are. However, it may be advantageous in some situations to create air gaps covering the entire height of a layer in the case of layers having a high current density. FIG. 3 explains the process 300, which is an alternate embodiment describing a full height air gap in an ILD.

Figure 4A:
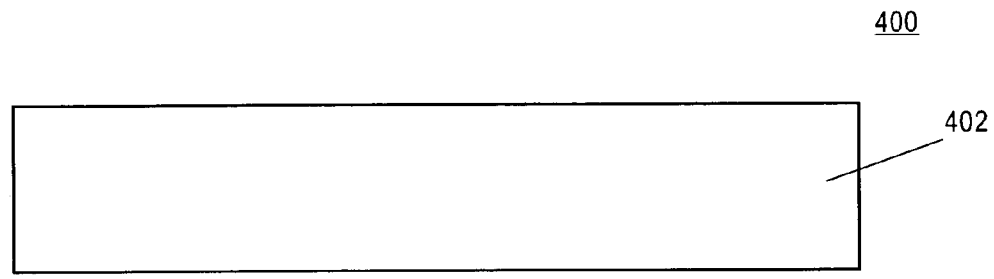
FIGS. 4A through 4O illustrate a process for forming a full height air gap interconnect structure.
Figure 4B:
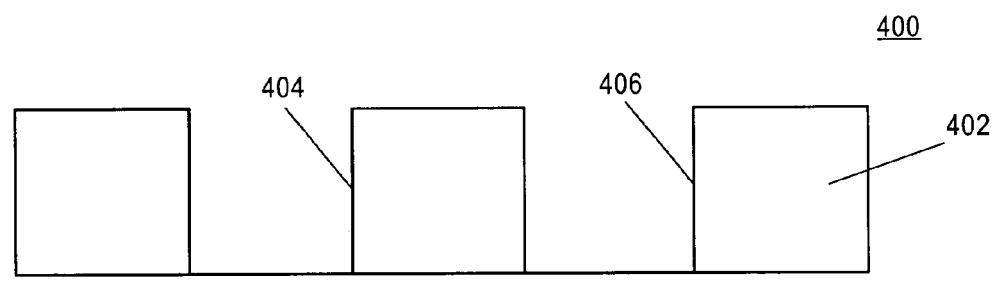
Figure 4C:
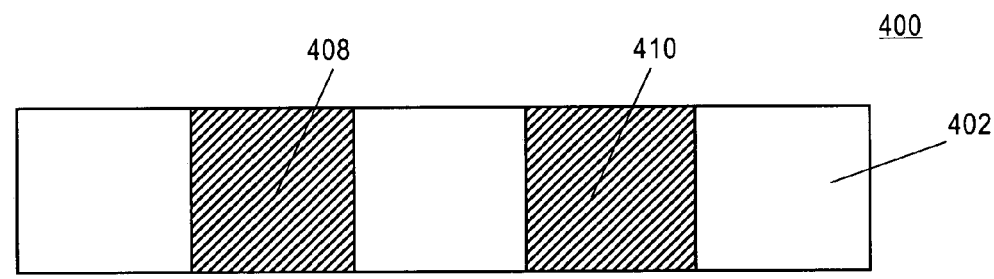
Figure 4D:
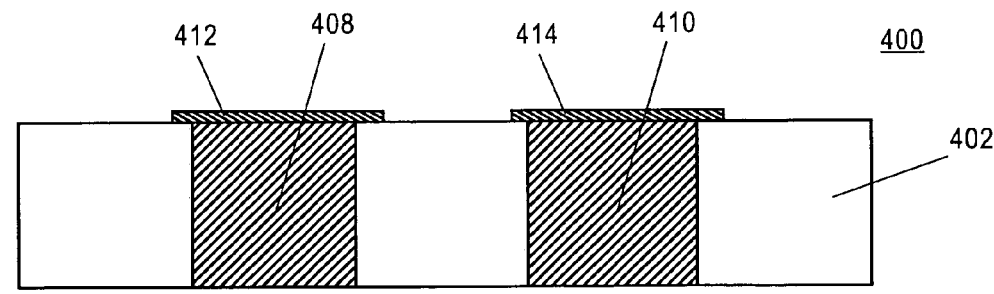
Figure 4E:
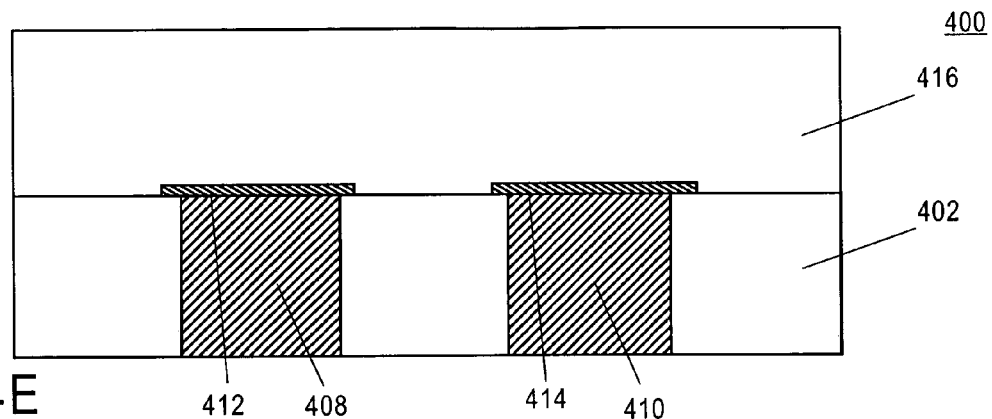
Figure 4F:
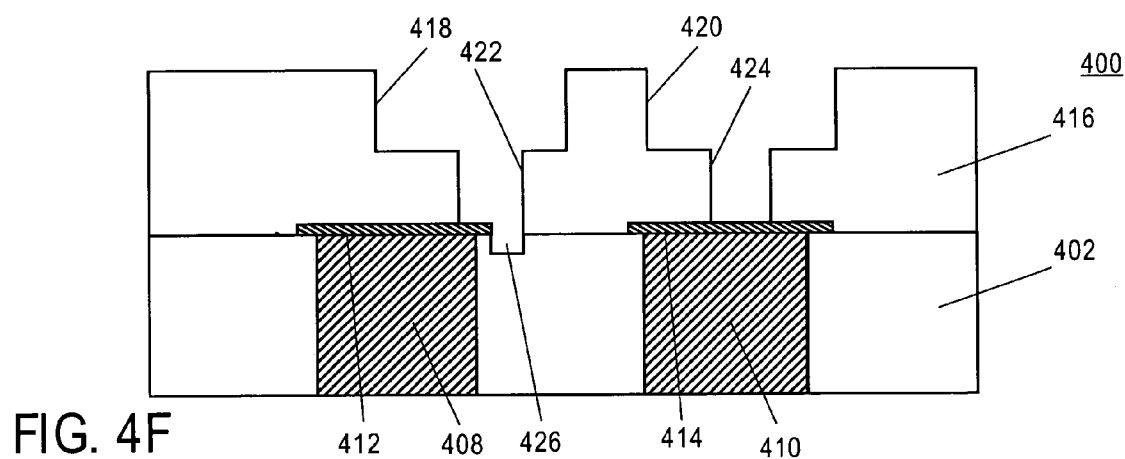
Figure 4G:
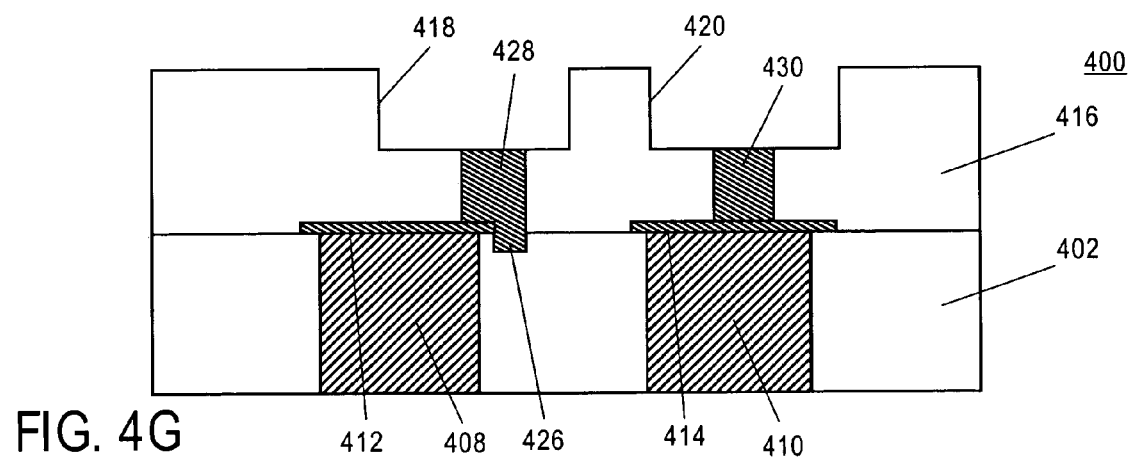
Figure 4H:
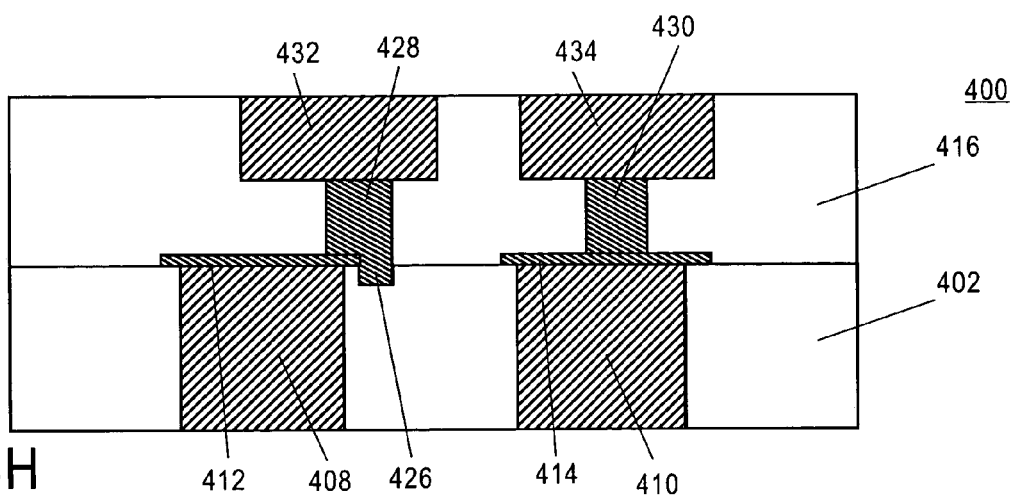
Figure 4I:
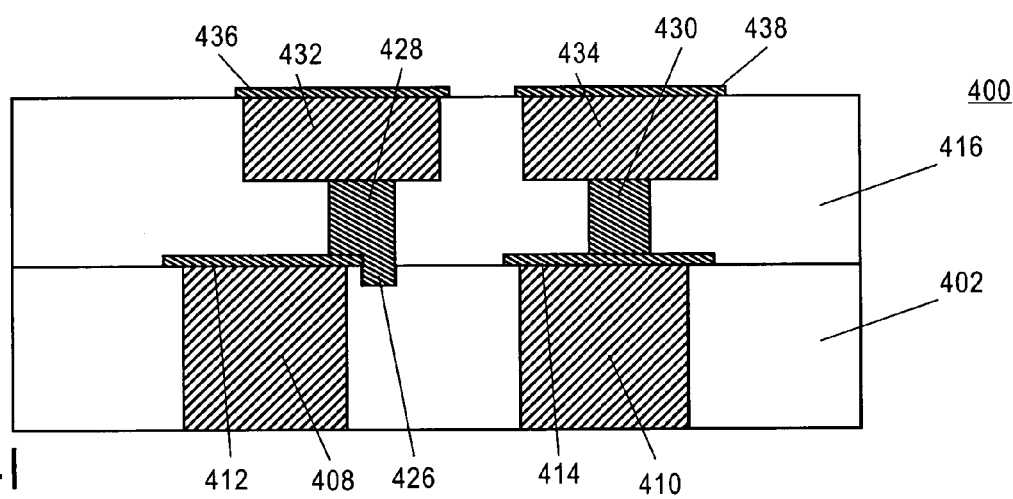
Figure 4J:
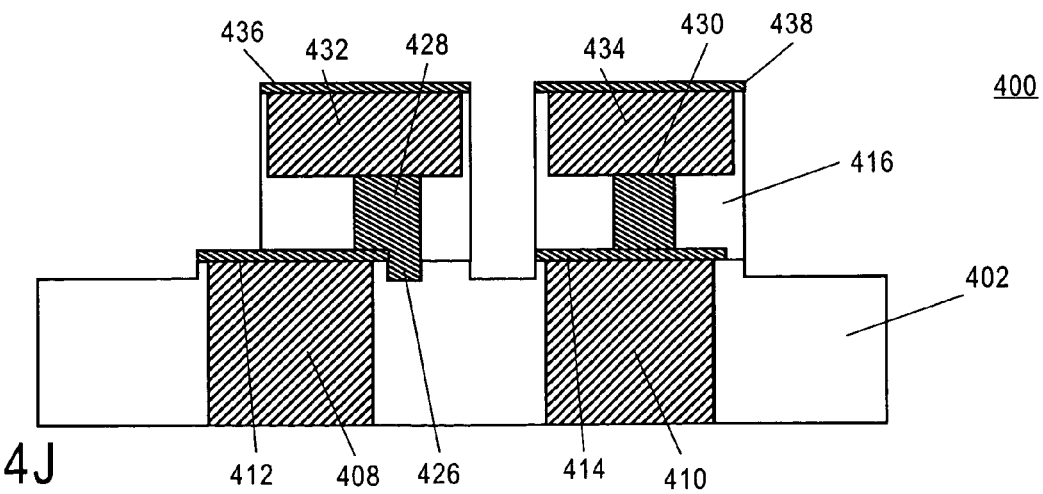
Figure 4K:
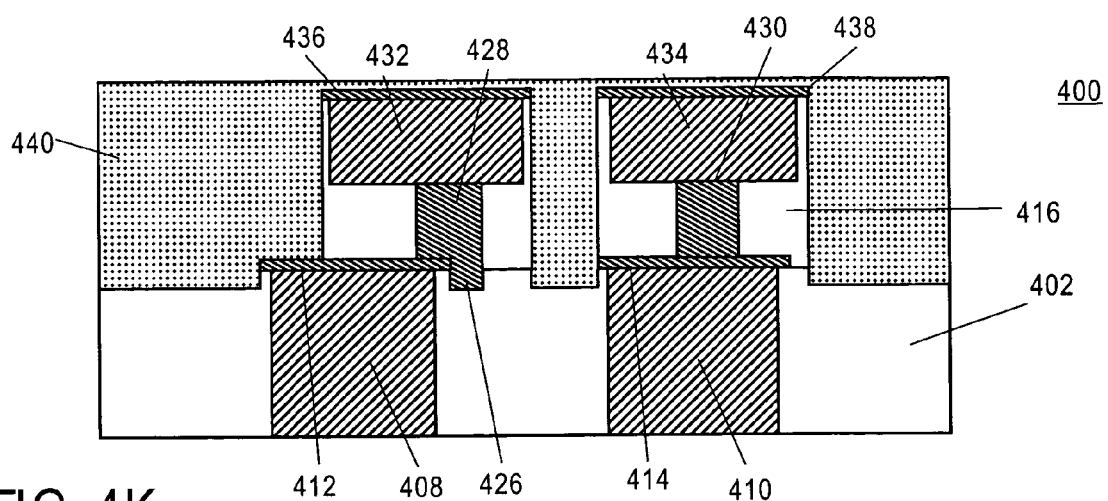
Figure 4L:
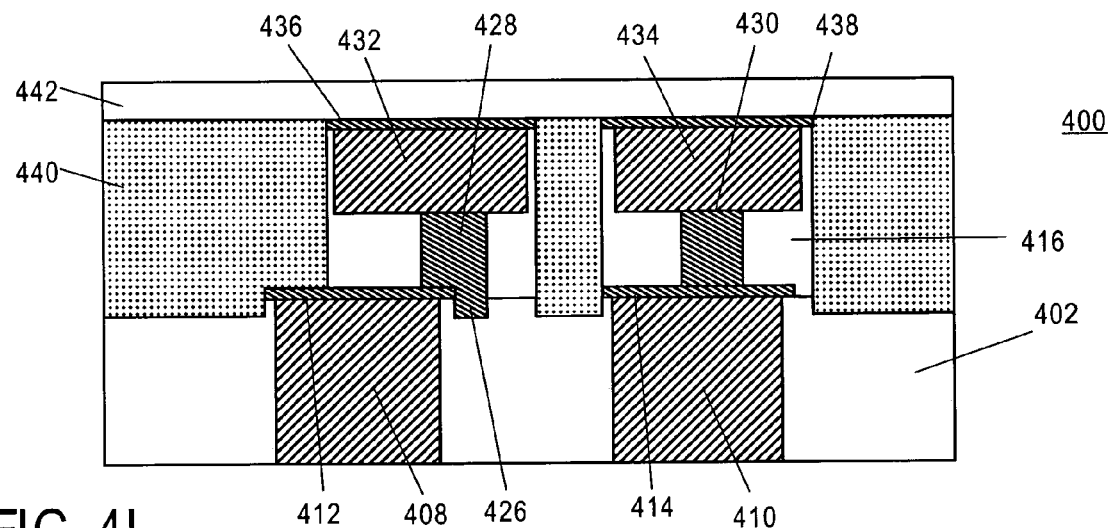
Figure 4M:
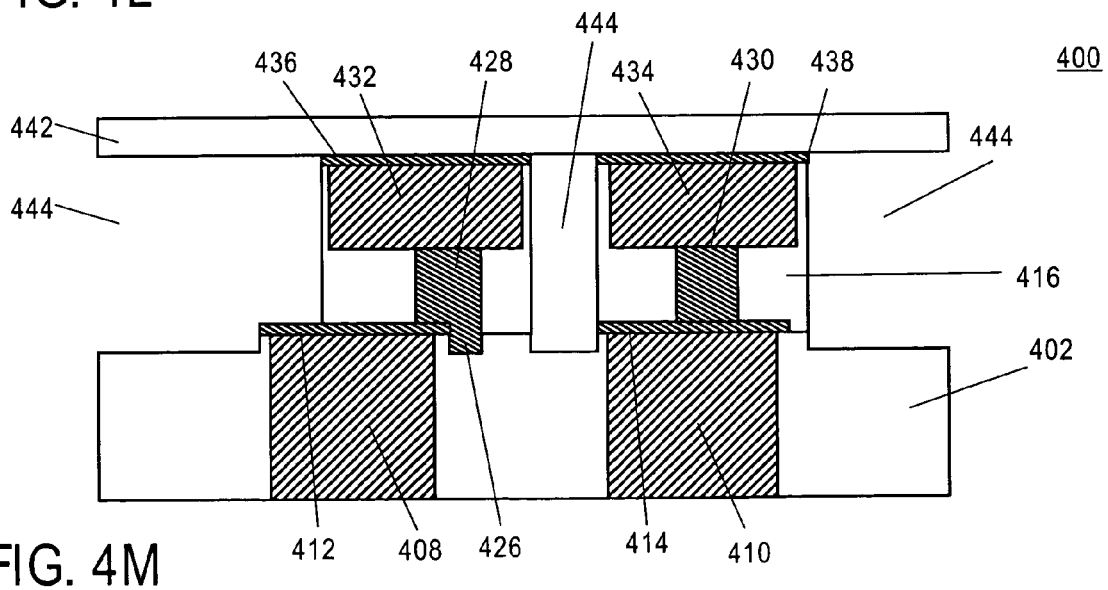

FIG. 3 illustrates an embodiment for fabricating shunts and via plugs in an air gap metallization structure. The process 300 starts in start block 302. In block 304 a first layer is formed. FIGS. 4A through 4O illustrate a process for forming a full height air gap interconnect structure. FIG. 4A illustrates a deposited first layer ILD 402. The ILD 402 may be formed above another layer of metallization or a substrate. The ILD 402 may, as above, be $SiO_2$ or a low-k ILD. In block 306, the ILD 402 is patterned to create at least one recessed feature. FIG. 4B illustrates a patterned ILD 402. The trenches 404 and 406 have been formed in the ILD 402 using a damascene process.

In block 308, a first at least one interconnect is formed in the first layer. FIG. 4C illustrates the ILD 402 having two interconnects 408 and 410 formed in it. The interconnects 408 and 410 may comprise copper or aluminum, and may be formed by depositing metal in the trenches 404 and 406 as described above. In block 310, a shunt is deposited on the first of at least one interconnect. As above, the shunt may be Co, Ni, etc., and maybe deposited using an EL deposition process. FIG. 4D illustrates two interconnects 408 and 410 having two shunts 412 and 414 deposited over them. The shunts 412 and 414 may be deposited using an EL deposition process which activates the interconnects 408 and 410, as above. The shunts 412 and 414 can protect the layers to be deposited above the ILD 402 from diffusion and electromigration caused by the interconnects 408 and 410.

In block 312, a second layer is formed over the first layer. FIG. 4E illustrates a second layer deposited above the first ILD 402. The second layer 402 may be a typical ILD such as $SiO_2$ or a low-k ILD. In block 314, the second layer is patterned. FIG. 4F illustrates the second layer 416 having damascene formed recessed features. The trenches 418 and 420, and the vias 422 and 424 have been formed in the second layer 416. While creating the via 422, an unlanded portion 426 extending into the ILD 402 has inadvertently been formed. The unlanded portion 426 extends into the ILD 402, and metal deposited the via 422 may contaminate or extrude into the ILD 402.

In block 316, a Co or Ni via plug is deposited in the vias 422 and 424. FIG. 4G illustrates the vias 422 and 424 having via plugs being deposited in them. The via plugs 428 and 430 can be deposited using an EL deposition process. The via portion of the interconnect structure does not require a high conductivity material because the main signal travels through the interconnects. Therefore, a lower conductivity material such as Co or Ni can form the via. The Co or Ni will not contaminate an ILD as a copper via will. Therefore, the Co or Ni deposited in the via 422 and the unlanded portion 426 will not diffuse into the ILD 402. Other materials, such as those described above, can also be used to create the via plugs 428 and 430.

In block 318, a second at least one interconnect is created in the second layer. FIG. 4H illustrates two interconnects 432 and 434 formed in the second layer 416. As described above, the interconnects 432 and 434 may be a conductive material such as copper which is deposited using well-known methods. After the conductive material has been deposited, a CMP process has been used to planarize the second layer 416. In block 320, a shunt is deposited on the second at least one interconnect. FIG. 4I illustrates the interconnects 432 and 434 having shunts 436 and 438 over the interconnects 432 and 434. As descried above, these shunts may be Co, Ni, etc. and may be deposited over the interconnects 432 and 434 using an EL deposition process. Also, as above, the shunts protect higher level ILDs from contamination caused by interconnects 432 and 434.

In block 322, the second layer is etched to remove a portion of the second layer. FIG. 4J illustrates a metallization structure having a portion of its second layer etched away. The second layer 416 may be partially etched using a reactive-ion etching (RIE) or another appropriate etch process. The etch will remove the portions of the ILD not directly underneath the shunts 436 and 438. The shunts 436 and 438 will act as an etch stop to prevent the interconnects 408, 410, 432, and 432, and portions of the ILDs 402 and 416 from being removed. The etch may also remove a portion of the ILD 402. However, in one embodiment, the etch can be timed to remove as little of the ILD 402 as possible.

In block 324, a sacrificial ILD is deposited in place of the second layer. FIG. 4K illustrates sacrificial ILD 440 in a metallization structure. The sacrificial ILD, as mentioned above, is a thermally decomposing polymer such as Unity™. The sacrificial ILD 440 has been deposited using well known deposition techniques in place of the etched portions of the second layer 416. In block 326, a third ILD is formed over the sacrificial ILD. FIG. 4L illustrates a third ILD 442 deposited above the sacrificial ILD. Before depositing the third ILD 442, the sacrificial ILD 440 must be planarized using CMP or another process. The third ILD 442 may be any ILD appropriate for the application, such as $SiO_2$ or a low-k ILD. The shunts 436 and 438 will protect the third ILD 442 from contamination caused by the interconnects 432 and 434.

In block 328, the sacrificial ILD 440 is evaporated. FIG. 4M illustrates an interconnect structure having air gaps 444. The sacrificial ILD 440 can be evaporated even though new layers have been built upon it by exposing the entire interconnect structure 400 to a high heat. For example, when using the Unity™ film, the sacrificial ILD 440 can be evaporated at a temperature of 400° centigrade. By evaporating the sacrificial ILD 440, air gaps 444 are created where the sacrificial ILD once was. As can be seen in FIG. 4M, portions of the second layer 416 still remain, however, the air gaps 444 help isolate the interconnects 432 and 434. Because air has a very low dielectric constant, the cross talk and capacitive coupling are significantly reduced by the air gaps 444. Further, the vias 428 and 430 will not diffuse into the ILD 402 because they comprise a material which does not rapidly diffuse or electromigrate. Also, the third ILD 442 will remain free from contamination because the shunts 436 and 438 have protected it. In an air gap interconnect structure, the integrity of the ILDs 402 and 442 becomes especially important because of the lower structural strength of the remaining interconnect structure. Therefore, it is especially important to protect the ILDs 402 and 442 from the contamination from the sources such as the interconnects 432 and 434. Once the sacrificial ILD has been evaporated in block 328, the process 300 moves onto the finish block 330 and the process is complete. FIG. 4O illustrates an alternate embodiment where the vias 428 and 430 comprise the same material as the interconnects 432 and 434. Because the thick barriers 452 protect against diffusion, it may not be necessary in some cases to use the via plugs as described above.

Figure 4N:
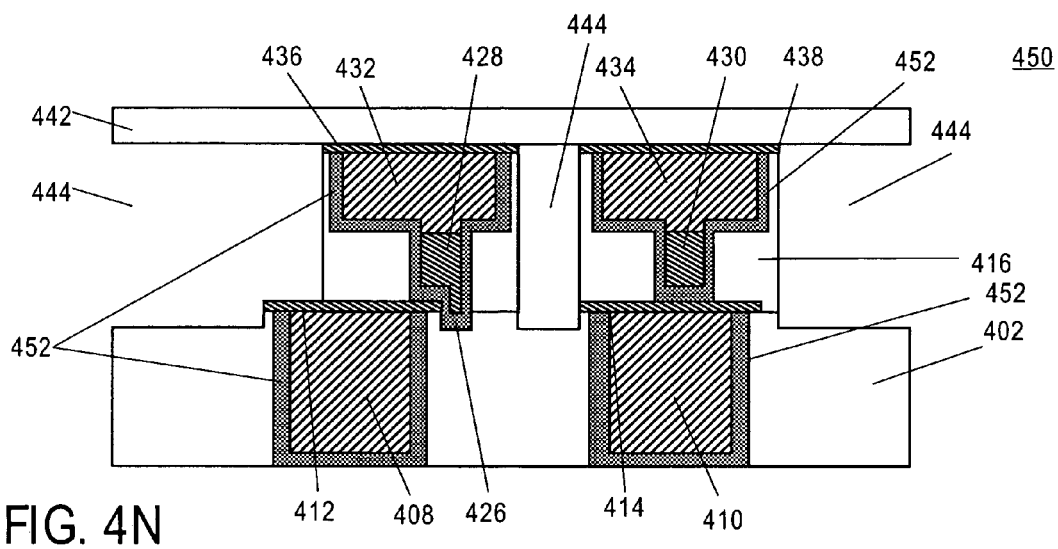
Figure 4O:
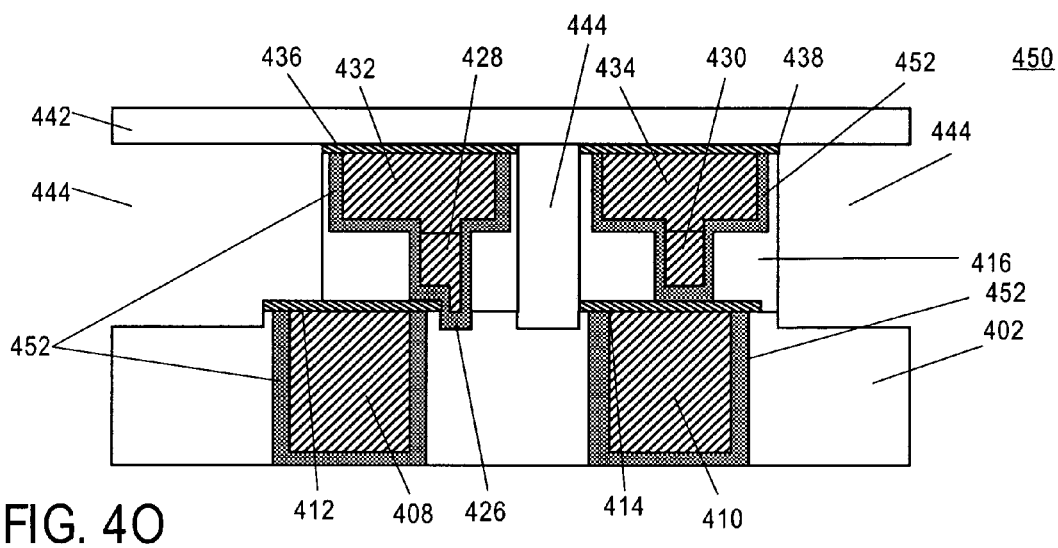

FIG. 4N illustrates a interconnect structure using shunts, via plugs, and thick barriers. The deposition of the shunts 412, 414, 436, and 438, and the via plugs 428 and 430 has been described above with relation to FIGS. 3 and 4. The thick barriers 452 may be deposited in the recessed features of the ILD in order to provide a diffusion barrier, an adhesion layer, a carrier for electrical current in voids in a conductive line, and can provide additional mechanical strength to prevent extrusion of conductive lines. The process for depositing the thick barrier will be disused with respect to FIG. 5. It will be understood when the additional mechanical strength provided by a thick barrier layer will be especially important in an air gap interconnect structure because of the compromised strength of the air gap structure due to the removal of ILD material.

Figure 5:
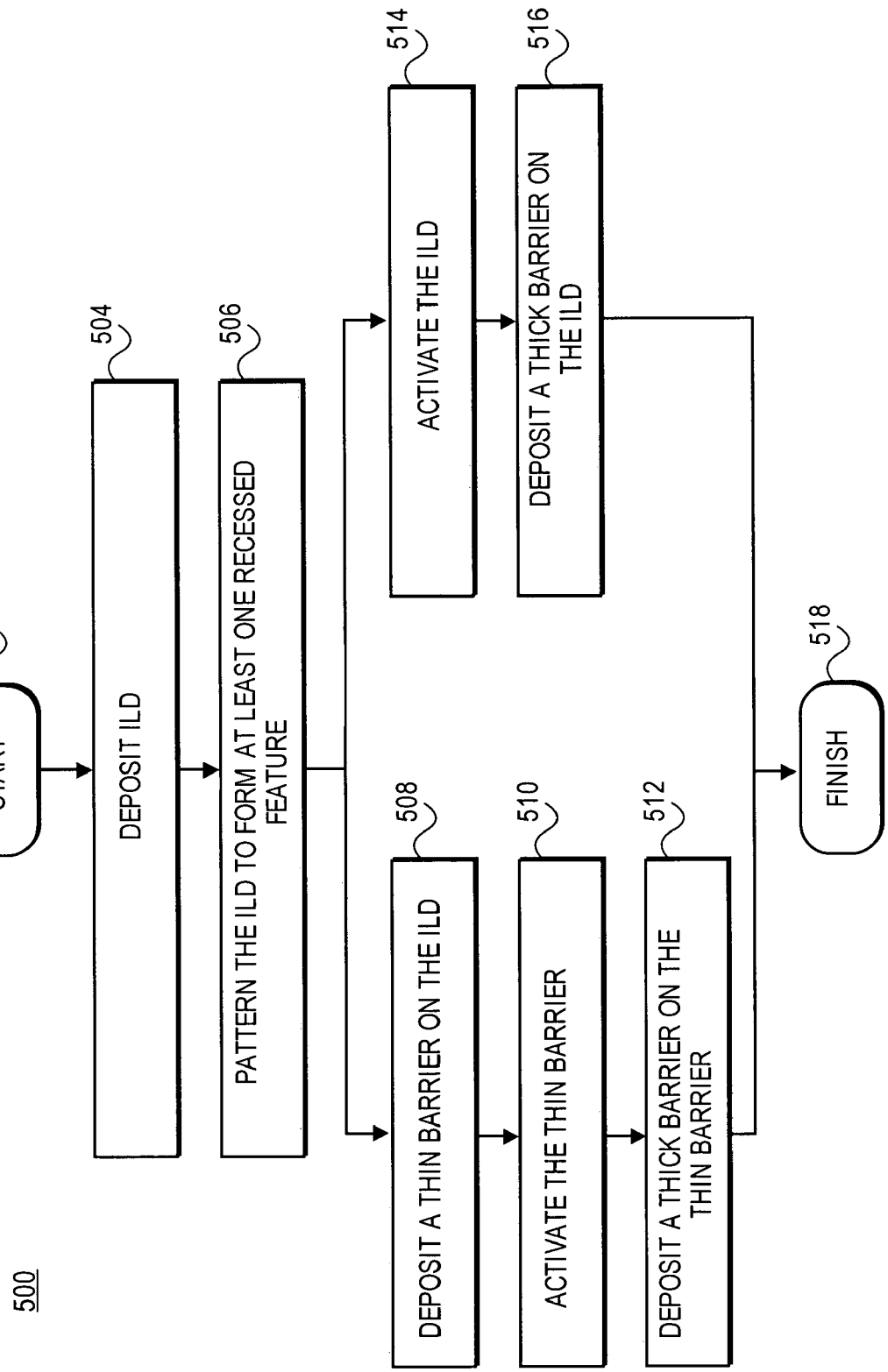
FIG. 5 illustrates an embodiment for forming a thick barrier layer on an ILD.

FIG. 5 illustrates an embodiment for forming a thick barrier layer on an ILD. A barrier layer can act as a diffusion layer to protect an ILD, as well as filling in voids that are present in the conductive lines. A thick barrier layer may have a thickness of between 50 and 500 Angstroms (Å), which can provide superior characteristics over barrier layers typically used in air gap interconnect structures. Further, a thick barrier layer can prevent extrusion caused by weak structures found in air gap interconnect structures, because the thicker layer will have greater mechanical strength. The barrier layers 208, 210, 236, 238 and 452 as shown in FIGS. 2M, 4N, and 4O illustrate using the process 500 to improve an air gap interconnect structure.

Figure 6A:
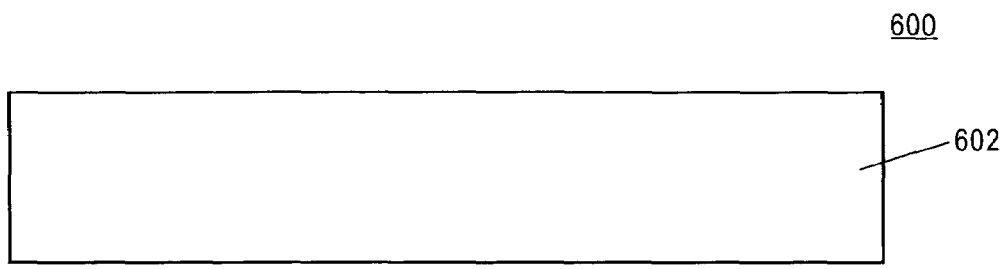
FIGS. 6A-6E illustrating a process for forming a thick barrier layer on an ILD.
Figure 6B:
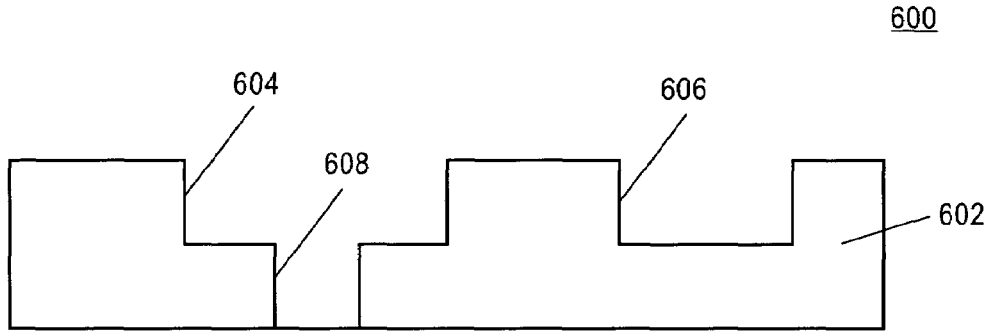

The process 500 starts in start block 502. In block 504, an ILD is deposited. FIG. 6a illustrates a deposited ILD 602. The ILD 602 may, as above, be $SiO_2$ or another dielectric material. In block 506, the ILD 602 is patterned to form at least one recessed feature. FIG. 6B illustrates an ILD having been patterned to form the trenches 604 and 606, and a via 608.

Figure 6C:
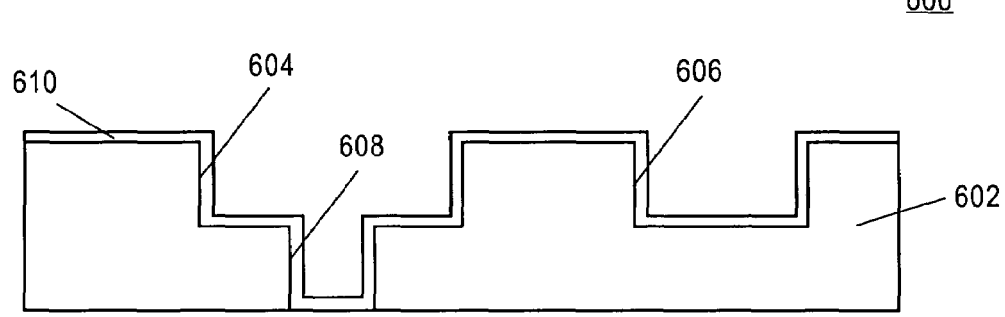
Figure 6D:
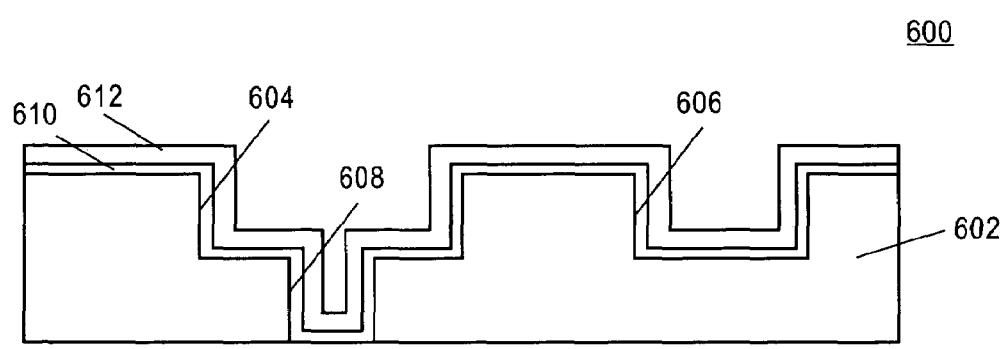

Blocks 508–512, and blocks 514–516 each detail an alternative technique for forming a thick barrier layer over an ILD. Blocks 508–512 illustrate a three operation process while blocks 514–516 illustrate a two operation process. In block 508, a thin barrier is deposited over the layer. FIG. 6C illustrates a thin barrier 610 deposited over the ELD 602. The thin barrier 610 can be deposited using physical vapor deposition (PVD), chemical vapor deposition (CVD), atomic layer deposition (ALD), etc. The thin barrier 610 can be tantalum (Ta), tantalum nitride (TaN), tantalum silicon nitride (TaSiN), titanium nitride (TiN), titanium silicon nitride (TiSiN), tungsten nitride (WN), tungsten silicon nitride (WSiN), tungsten carbide nitride (WCN), etc. In block 510 the thin barrier 610 is either activated or a seed layer is deposited over the thin barrier 610. The thin barrier 610 can be activated in noble metal compounds such as palladium chloride ($PdCl_2$) in water, $Pd^{2+}$ in azole silane, etc. Once the thin barrier 610 is activated, if a wafer containing the structure 600 is immersed in a chemical bath, ions will adhere to the activated portions of the ILD 602, and a thick barrier can be deposited on the thin barrier in block 512. FIG. 6D illustrates a thick barrier 612 deposited over a thin barrier 610. The thick barrier 612 can be EL Co or Ni. Alternatively, a seed layer comprising Co, Ni, copper (Cu), palladium (Pd), gold (Au), silver (Ag), ruthenium (Ru), or rhodium (Rh) can be deposited over the thin barrier 610 using PVD, CVD, ALD, etc. If a seed layer is used an electroplating deposition method can be used. After a seed layer is deposited, a current can be applied to the seed layer, and the wafer can be deposited in a chemical bath. Ions will then adhere to the seed layer, forming the thick barrier.

Figure 6E:
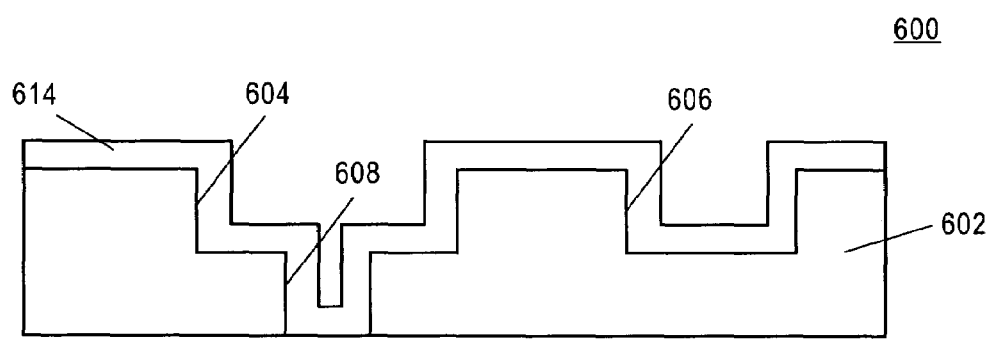

The alternative two-step process begins in block 514 where the ILD 602 is activated. In block 516, the thick barrier layer is deposited. After activation, as above, the Co or Ni barrier layer can be deposited on the ILD 602 using EL deposition. FIG. 6E illustrates an EL deposited thick barrier 614 according to the alternate embodiment.

An air gap interconnect structure can be formed to create an ultra low-k ILD. However, the structure becomes very weak because of the gaps. Therefore, shunts and structural reinforcements can help to maintain and increase the strength of the structure. The strategic shunts, via plugs, and barrier layers can help to protect against diffusion and electromigration, while mechanically strengthening the structure.

This invention has been described with reference to specific exemplary embodiments thereof. It will, however, be evident to persons having the benefit of this disclosure that various modifications and changes may be made to these embodiments without departing from the broader spirit and scope of the invention. The specification and drawings are, accordingly, to be regarded in an illustrative rather than a restrictive sense.

What is claimed is:

1. An apparatus comprising:
   a first layer having a first at least one interconnect formed in an interlayer dielectric (ILD);
   a second layer formed over the first layer, the second layer having a second at least one interconnect, and wherein the second layer comprises a first sublayer and a second sublayer, the first sublayer is between the first layer and the second sublayer, and the second sublayer is between the first sublayer and a third layer, the first sublayer comprising an ILD, and the second sublayer comprising air;
   the third layer formed over the second layer, the third layer defining at least one air gap between the second at least one interconnect and the third layer; and
   at least one shunt comprising a first material different from a second material of the first and second at least one interconnects selectively covering the top of the first and second at least one interconnects, wherein the first material has a property that inhibits electromigration of the second material into the second layer or third layer.

2. The apparatus of claim 1, further comprising a barrier layer to support the first and second at least one interconnects.

3. The apparatus of claim 2, wherein the barrier layer has a thickness of between 50 and 500 Angstroms.

4. The apparatus of claim 1, further comprising:
   at least one via having a via plug, the via plug is selected from the group consisting of cobalt and nickel.

5. The apparatus of claim 4, wherein the via plug is deposited using electroless deposition.

6. The apparatus of claim 1, wherein the second at least one interconnect is within the second sublayer.

7. The apparatus of claim 1, wherein the second layer comprises air.

8. The apparatus of claim 1, wherein the first material comprises one of nickel, cobalt, a nickel alloy, and a cobalt alloy.

9. The apparatus of claim 8, wherein the first material comprises an electroless conductor.

10. An apparatus comprising:
    a first layer having a first at least one interconnect formed in an interlayer dielectric (ILD);
    a second layer formed over the first layer, the second layer having a second at least one interconnect, and wherein the second layer comprises a first sublayer and a second sublayer, the first sublayer is between the first layer and the second sublayer, and the second sublayer is between the first sublayer and a third layer, the first sublayer comprising an ILD, and the second sublayer comprising air;
    the third layer formed over the second layer, the third layer defining at least one air gap between the second at least one interconnect and the third layer; and
    at least one shunt comprising a first material different from a second material of the first and second at least one interconnects selectively covering the top of the first and second at least one interconnects, wherein the second at least one interconnect comprises a metal exposed to the at least one air gap.

11. An apparatus comprising:
    a first layer having a first at least one interconnect formed in an interlayer dielectric (ILD);
    a second layer formed over the first layer, the second layer having a second at least one interconnect, and wherein the second layer comprises a first sublayer and a second sublayer, the first sublayer is between the first layer and a second sublayer, and the second sublayer is between the first sublayer and the third layer, the first sublayer comprising an ILD, and the second sublayer comprising air;
    the third layer formed over the second layer, the third layer defining at least one air gap between the second at least one interconnect and the third layer; and
    at least one shunt comprising a first material different from a second material of the first and second at least one interconnects selectively covering the top of the first and second at least one interconnects;
    a barrier layer to support the first and second at least one interconnects, and to carry an electrical current between a first shunt covering the top of the first at least one interconnect and a second shunt covering the top of the second at least one interconnect.

12. An apparatus comprising:
    a first layer having a first at least one interconnect formed in an interlayer dielectric (ILD);
    a second layer formed over the first layer, the second layer having a second at least one interconnect, and wherein the second layer comprises a first sublayer and a second sublayer, the first sublayer is between the first layer and the second sublayer, and the second sublayer is between the first sublayer and a third layer, the first sublayer comprising an ILD, and the second sublayer comprising air;
    the third layer formed over the second layer, the third layer defining at least one air gap between the second at least one interconnect and the third layer; and
    at least one shunt comprising a first material different from a second material of the first and second at least one interconnects selectively covering the top of the first and second at least one interconnects;
    a barrier layer to support the first and second at least one interconnects, wherein the barrier layer comprises one of electroless nickel and electroless cobalt.

* * * * *